United States Patent
Forstmaier et al.

(10) Patent No.: US 10,200,031 B2
(45) Date of Patent: Feb. 5, 2019

(54) ELECTRONICALLY SWITCHABLE DIPLEXER

(71) Applicant: Rohde & Schwarz GmbH & Co. KG, Munich (DE)

(72) Inventors: Rudolf Forstmaier, Dorfen (DE); Bernhard Schaffer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 99 days.

(21) Appl. No.: 15/230,200

(22) Filed: Aug. 5, 2016

(65) Prior Publication Data
US 2017/0302269 A1    Oct. 19, 2017

Related U.S. Application Data

(60) Provisional application No. 62/323,166, filed on Apr. 15, 2016.

(51) Int. Cl.
*H03K 17/74*    (2006.01)
*H03K 17/693*    (2006.01)

(52) U.S. Cl.
CPC .......... *H03K 17/74* (2013.01); *H03K 17/693* (2013.01)

(58) Field of Classification Search
CPC ... H04B 3/52; H04B 3/54; H04B 3/56; H04B 3/58; H03K 17/74; H03K 17/693
USPC ........................................ 327/427, 434–437
See application file for complete search history.

(56) References Cited

U.S. PATENT DOCUMENTS

| | | | |
|---|---|---|---|
| 2011/0163792 A1 | 7/2011 | Ando | |
| 2013/0257510 A1* | 10/2013 | Suzaki | H03K 17/693 327/374 |
| 2013/0314171 A1 | 11/2013 | Eineder et al. | |
| 2014/0055210 A1* | 2/2014 | Black | H04B 1/525 333/132 |
| 2014/0062218 A1 | 3/2014 | Chih-Sheng | |

FOREIGN PATENT DOCUMENTS

EP    1780889    5/2007

* cited by examiner

*Primary Examiner* — Lincoln D Donovan
*Assistant Examiner* — Diana J. Cheng
(74) *Attorney, Agent, or Firm* — Lee & Hayes, PC

(57) ABSTRACT

An electronically switchable diplexer (200), especially an electronically switchable diplexer (200) with low video crosstalk, comprises a low-pass terminal (210), a terminal (220) for feeding in a first control signal, a common terminal (230), a high-pass terminal (240), and a terminal (250) for feeding in a second control signal, wherein the low-pass path of the diplexer (200) operates down to DC (direct current).

22 Claims, 4 Drawing Sheets

ELECTRONICALLY SWITCHABLE DIPLEXER

This Application claims priority to U.S. Provisional Application No. 62/323,166, filed Apr. 15, 2016, which is incorporated herein by reference.

TECHNICAL FIELD

The invention relates to an electronically switchable diplexer, especially an electronically switchable diplexer with low video crosstalk, which comprises a low-pass path operating down to DC.

BACKGROUND ART

Generally, electronically switchable diplexers are key components for joining or separating signal paths of different frequency bands. They are for example used in signal generator applications because the usage of such diplexers allows for low-loss switching the signals generated by several signal generator modules of a signal generator, each module operating at another frequency band, to a common output of the signal generator according to a desired output frequency. Switchable diplexers can also be used in signal receivers, for instance in spectrum analyzers, where they allow switching of the received signals at the common input terminal into separate receiving paths according to their frequency.

EP 1 780 889 A1 discloses a switchable diplexer to be used for microwave and radio frequency applications. As the PIN-diodes of the switching elements of this switchable diplexer are directly coupled to the signal line, such a diplexer has a DC charge on the common terminal and the low frequency terminal DC charge could destroy circuit components beyond the terminals for example in the device under test (DUT) connected to the common terminal. Furthermore, a DC signal applied at the common terminal, for example from a device under test, could alter the switching state of the diplexer. If this DC charge was blocked by a blocking capacitor the diplexer would not be suitable for operating at low frequencies down to DC (direct current). In addition to this, so-called video crosstalk caused by transient switching disturbances is disadvantageously not suppressed. In an example of this document, the switching elements are isolated from the transmission path via a capacitor, the switching elements are however no semiconductor devices. This means that the switching time is rather long.

Accordingly, there is a need to provide an electronically switchable diplexer with low insertion loss, which, on the one hand, avoids DC charge on the terminals and the switching state of which is immune to a DC signal applied to the common terminal, but still allows for operating at low frequencies down to DC, and on the other hand, ensures low video crosstalk by suppressing transient switching disturbances. Additionally, the usable frequency bands of the diplexer should overlap each other, so that there is no gap between the bands where the insertion loss is high.

SUMMARY OF THE INVENTION

According to one aspect of the invention, a diplexer comprises a first terminal for a first RF signal connected via a first transmission path to a common terminal and a second terminal for a second RF signal connected via a second transmission path to the common terminal. Furthermore, the first transmission path is connected to a ground potential via a first switching element, which has no galvanic connection to the common terminal. The second transmission path is connected to the ground potential via a second switching element, which has no galvanic connection to the common terminal. In addition to this, the switching elements are semiconductor devices.

According to a first preferred implementation form, the first switching element has no galvanic connection to the first terminal or the second terminal.

According to a further preferred implementation form, the second switching element has no galvanic connection to the first terminal or the second terminal.

According to a further preferred implementation form, the first transmission path comprises a transmission line. Additionally, a connection point between the first terminal and the transmission line is connected to the first switching element via a first capacitor.

According to a further preferred implementation form, the side of the first capacitor, which is not connected to the first transmission path, is connected to the first switching element. The first switching element is biased with a first control signal.

According to a further preferred implementation form, the first transmission path comprises a transmission line. In addition to this, a connection point between the first terminal and the transmission line is connected to the first switching element via a first capacitor and a second capacitor.

According to a further preferred implementation form, the side of the second capacitor, which is not connected to the first capacitor, is connected to the first switching element. The first switching element is biased with a first control signal.

According to a further preferred implementation form, a connection point between the first capacitor and the second capacitor is connected to the ground potential via a resistor, an inductor, a transmission line or a combination thereof.

According to a further preferred implementation form, the second transmission path comprises a first capacitor arranged between a connection point connected with the second switching element and the common terminal.

According to a further preferred implementation form, the second transmission path comprises a second capacitor between a connection point connected to the second switching element and the second terminal.

According to a further preferred implementation form, the connection point is connected to the ground potential via a serial arrangement of a third capacitor and an inductor.

According to a further preferred implementation form, the second switching element is biased with a second control signal.

According to a further preferred implementation form, the second transmission path comprises a serial arrangement of a first capacitor and a second capacitor arranged between a connection point connected to the second switching element and the common terminal.

According to a further preferred implementation form, a connection point between the first capacitor and the second capacitor is connected to the ground potential via a resistor, an inductor, a transmission line or a combination thereof.

According to a further preferred implementation form, the second transmission path comprises a third capacitor arranged between the second capacitor and the second terminal.

According to a further preferred implementation form, a connection point between the second capacitor and the third capacitor is connected to the second switching element. The second switching element is biased with a second control signal.

According to a further preferred implementation form, the first switching element and the second switching element are diodes or transistors.

According to a further preferred implementation form, the diodes are PIN-diodes and/or the transistors are field effect transistors, respectively.

According to a further preferred implementation form, through switching the first switching element to the open state and switching the second switching element to the conducting state, the first transmission path is set to the on-state and the second transmission path is set to the off-state. Respectively, through switching the first switching element to the conducting state and switching the second switching element to the open state, the first transmission path is set to the off-state and the second transmission path is set to the on-state.

According to a further preferred implementation form, multiple capacitors are connected between the connection point and the first switching element.

According to a further preferred implementation form, the side of the last capacitor which is not connected to another capacitor and is not connected to the first transmission path, is connected to the first switching element, and the first switching element is biased with a first control signal.

According to a further preferred implementation form, each connection point between two of said capacitors is connected to ground via a resistor, an inductor, a transmission line or a combination thereof.

BRIEF DESCRIPTION OF THE DRAWINGS

Exemplary embodiments of the invention are now further explained with respect to the drawings by way of example only, and not for limitation. In the drawings.

DETAILED DESCRIPTION OF PREFERRED EMBODIMENTS

Figure 1:
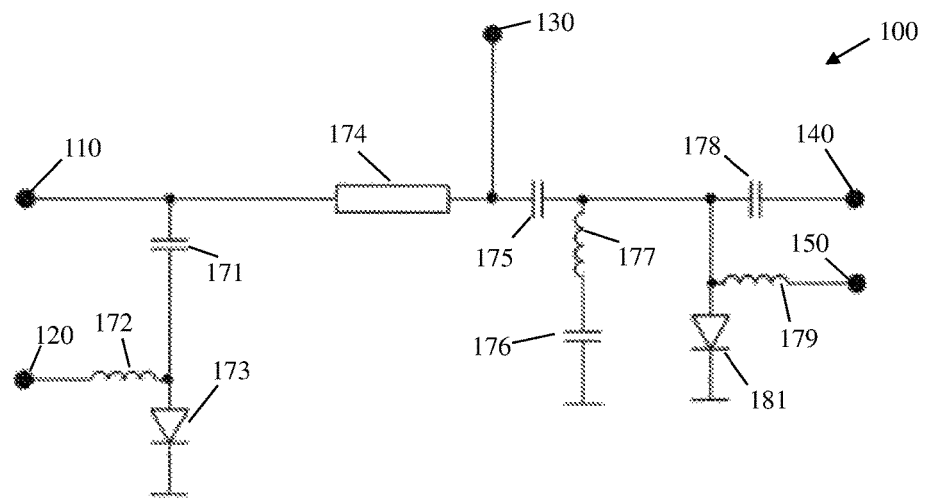
FIG. 1 shows a circuit diagram of a first exemplary embodiment of the inventive diplexer.

In advance, before exemplary embodiments of the invention are explained with respect to the drawings by way of example, some features and effects of the present invention should be summarized in the following.

In general, the inventive diplexer provides a very large operating frequency range. Whereas at least one switchable low-pass path of the diplexer operates from low frequencies preferably such as kilohertz or even from DC up to high frequencies, for example in the microwave or millimeter wave region, one or more other signal paths are able to operate up to a high frequency range such as millimeter wave range.

Around the crossover frequency between two signal paths of adjacent frequency bands, non-switchable or passive diplexers split the signal power into both paths, which leads to a minimum insertion loss of 3 dB.

By choosing one switching state of a switchable diplexer, one signal path is brought to a low insertion loss state, (on-state), while the other path exhibits a much higher insertion loss (off-state). Therefore, most of the signal power is transmitted through the chosen signal path, leading to a much lower insertion loss compared to a non-switchable or passive diplexer, especially around the crossover frequency between the two adjacent frequency bands of two signal paths.

Therefore, switchable diplexers are advantageous compared to non-switchable or passive diplexers, because depending on their switching state, one path can be brought into an on-state while the other paths are in the off state, wherein "on-state" means a low insertion loss and "off-state" means a high insertion loss. This allows to combine or split signals of adjacent frequency bands with low insertion loss, without gaps in the operating frequency range.

The principal functioning of such a switchable diplexer can be described in a simplified way as following:

Between the first terminal and the common terminal, a lowpass filter structure is realized by a transmission line of length L, and a first shunt switching element is connected between the first signal path and ground. Between the second terminal and the common terminal, a highpass structure is realized by at least one series capacitor, and a second switching element is connected between the second path and ground.

In the lowpass state of the diplexer, the first switching element is switched to the open state while the second switching element is switched to the conducting state. A lowpass signal from the first terminal can now propagate from the first terminal to the common terminal or vice versa, since the series connection of the capacitor and the conducting second switching element comprises a part of the lowpass structure, therefore not disturbing the signal path. A highpass signal from the second terminal or the common terminal would be blocked by the high-frequency short circuit represented by the capacitor and the second switching element.

In the highpass state of the diplexer, the first switching element is conducting, while the second switching element is in an open state. Now a signal from the second terminal can pass the diplexer to the common terminal and vice versa. Although this signal is shorted to ground by the first switching element, this happens in a distance of L from the connection point. If L represents a quarter wave length at an operating frequency of the highpass path, this short circuit will be transformed to an open circuit at the connection point, therefore the short circuit will not disturb the signal propagation of the highpass signal. A lowpass signal from the first or the common terminal will be short-circuited by the conducting first switching element, and will therefore be blocked.

Applying different switching states to the switching elements requires DC control signals to be applied to them. These control signals need to be separated from the common input terminal and also from the first input terminal for multiple reasons. First, operation down to zero frequency (DC) is only possible if there is no DC control signal present on the lowpass path. Second, such a DC control signal on the signal path could destroy devices connected to the first or common terminal of the diplexer, such as fragile devices-under-test. Third, a DC voltage applied externally at the first or common terminal could otherwise influence the switching state of the diplexer, leading to malfunction.

For this purpose, instead of a direct coupling, each of the shunt switching elements of the low-pass path is coupled to the signal path with the aid of at least one serial coupling capacitor in order to avoid that a direct component of the control signal enters the signal path. Thus, between the low-pass terminal and the common terminal of the electronically switchable diplexer, a direct current connection advantageously not being separated by a bandwidth limiting serial capacitor may exist.

Furthermore, with the aid of an electronically switchable diplexer according to the present invention, video crosstalk caused by transient switching disturbances is reduced to a minimum or even completely avoided.

Generally, changes of the control voltage such as switching lead to a current flowing through the coupling capacitors, which is dependent on the terminating impedance of the signal line and causes a transient interference voltage at the common terminal of the electronically switchable diplexer.

Therefore, the usage of two or more coupling capacitors connected in series leads to one or more potential-free line sections between said capacitors, wherein each of the potential-free line sections is connected to ground via at least one appropriate impedance in order to dissipate a major part of the transient current without having negative impact on the signal line regarding transmission characteristics.

In an analogous manner, additionally or alternatively, with respect to high-pass and bandpass paths of the electronically switchable diplexer, two or more capacitors connected in series are inserted into the signal line between switching element and branching point. In order to dissipate transient switching disturbances without having negative impact on the radio frequency properties of the electronically switchable diplexer, each of the respective junction lines between said serial coupling capacitors is connected to ground via an appropriate impedance and/or via an inductive or a lambda quarter line.

As it can be seen, this inventive measure ensures that sensitive components or circuitry attached to a signal generator comprising such an electronically switchable diplexer are not getting damaged by transient switching disturbances.

Furthermore, it has to be considered that not only components or circuitry attached to the signal generator, respectively to the diplexer, but also, especially in the case of a high output power, the switching elements of the electronically switchable diplexer must not be damaged.

For this reason, especially shunt switching elements are used because, on the one hand, shunt elements allow for a better heat dissipation due to their ground connection, and on the other hand, the incoming signal power is almost completely reflected by the shunt element if the respective signal line is needed to be switched off.

Now, with respect to FIG. 1, a circuit diagram of an exemplary embodiment of the inventive diplexer is shown, wherein a low-pass terminal 110 is connected to a first terminal of a capacitor 171 and to a first terminal of a transmission line 174 which may be a lambda quarter line in order to transform a short of the respective switching element in form of a diode 173 into an open circuit. A second terminal of the capacitor 171 is connected to a second terminal of an inductance 172 and to a first terminal, especially the anode, of the diode 173. A first terminal of the inductance 172 is connected to a terminal 120 for feeding in a first control signal. Alternatively, the inductance 172 may be replaced by a resistor which may comprise a parasitic inductance, or by a combination of a resistor and an inductance. Furthermore, a second terminal, especially the cathode, of the diode 173 is connected to ground. A second terminal of the above-mentioned transmission line 174 is connected to a common terminal 130 and a first terminal of a capacitor 175. A second terminal of said capacitor 175 is connected to a first terminal of an inductance 177, to a first terminal of a capacitor 178, to a first terminal of an inductance 179 and to a first terminal, especially the anode, of a diode 181. Alternatively, the inductance 179 may be replaced by a resistor which may comprise a parasitic inductance, or by a combination of a resistor and an inductance. Whereas a second terminal, especially the cathode, of the diode 181 is connected to ground. Moreover, a second terminal of the inductance 177 is connected to a first terminal of a capacitor 176, wherein a second terminal of said capacitor 176 is connected to ground. A second terminal of the above-mentioned capacitor 178 is connected to a high-pass terminal 140. Additionally, a second terminal of said inductance 179 is connected to a terminal 150 for feeding in a second control signal.

It can be seen that regarding the low-pass path of the electronically switchable diplexer 100, there is the coupling capacitor 171 connecting the switching element in form of the diode 173 and the low-pass signal path.

As a consequence of the usage of the coupling capacitor 171, the low-pass terminal 110 may galvanically be connected to the common terminal 130 of the electronically switchable diplexer 100 via the transmission line 174 because the low-pass path is galvanically disconnected from the switching element and its control signal. This allows for very low operating frequencies even down to DC without limiting the maximum operating frequencies of the remaining transmission paths.

For instance, in order to achieve a better isolation of the low-pass path, multiple switching elements may be used. In this case, each of the switching elements has to be connected to the signal line via a coupling capacitor.

Moreover, whereas the first control signal fed into the terminal 120 is clearly not short-circuited, the capacitor 176 is necessary in order to avoid an electrical short of the second control signal fed into the terminal 150 via the inductance 177.

Additionally, it is to be mentioned that the above-mentioned DC decoupling is advantageous in any case—even if the switching elements comprise three or more terminals, wherein at least one terminal for feeding in a control signal is already galvanically separated from the remaining terminals. In this case, the signal line is DC-free anyway but the operating point of the respective switching element may however be changed by applying a DC voltage to the respective terminal, which may lead to malfunctions of the respective switching element.

In the case of a switched off low-pass path, or respectively a conductive switched switching element, applying an external DC voltage to the signal line may damage the respective switching element. This is avoided by coupling capacitor 171. Furthermore, switching between low-pass and high-pass operation causes the respective control signals to change over time in general.

Consequently, a time-varying voltage U(t) across the coupling capacitor 171, the coupling capacitor having the capacitance C, leads to a time-varying current $$I(t) = C * \frac{dU(t)}{dt}$$

flowing through said coupling capacitor, which causes a transient interference voltage on the signal line (transmission path) depending on the terminating impedance $Z_L$ of the latter.

Assuming linear changes of the respective control voltages by way of example only, and not for limitation, leads to a voltage level $U_1$ remaining constant during switching of duration $t_{Switch}$, wherein the following applies for said voltage level:

$$U_1 = Z_L * I(t) = Z_L * C * \frac{dU(t)}{dt}.$$

Furthermore, the above-mentioned explanations can analogously be applied to the control voltage of the second switching element in form of the diode 181, which leads to another interference voltage $U_2$. Thus, the total interference voltage $U_1+U_2$ occurs at the common terminal 130 of the electronically switchable diplexer 100.

Generally, such transient switching disturbances have to be suppressed in order to protect especially fragile or sensitive components or circuitry being attached to the common terminal 130 of the inventive diplexer 100 from getting damaged.

For this purpose, additional coupling capacitors and appropriate elements for the dissipation of occurring interferences can preferably be inserted into the inventive diplexer as follows.

On the one hand, the single coupling capacitor 171 of the low-pass path can be replaced by at least two coupling capacitors connected in series, and on the other hand, regarding the remaining high-pass and bandpass paths of the diplexer, the capacitor 175 located at the branching point should likewise be substituted by at least two capacitors connected in series. As a consequence of this series connection, there are one or more potential-free line sections between said capacitors, wherein each of the potential-free line sections is connected to ground via an appropriate resistor, an inductivity, a lambda quarter line or a combination thereof in order to dissipate a major part of the transient interference current without having negative impact on the signal line (transmission path) regarding the transmission characteristics.

Figure 2:
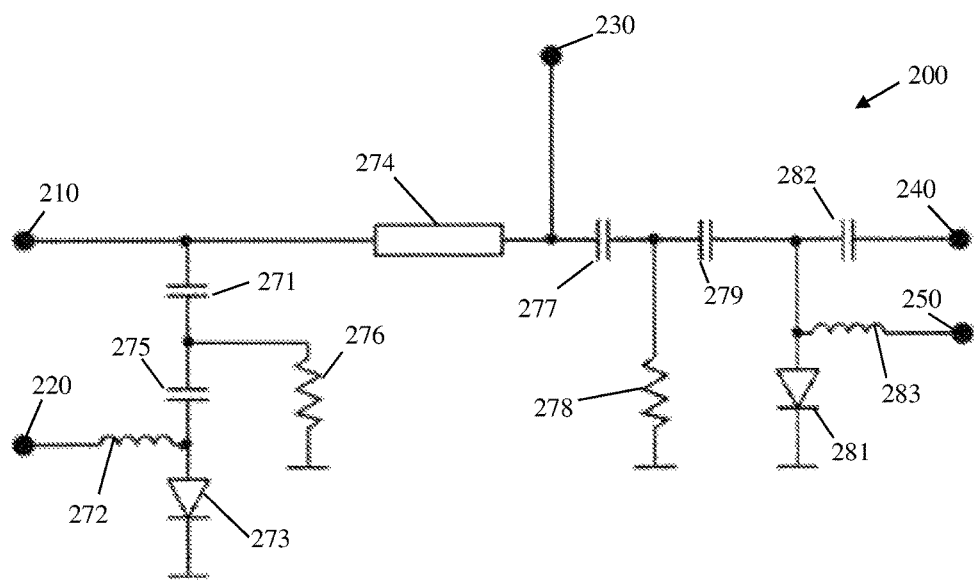
FIG. 2 shows a circuit diagram of a second exemplary embodiment of the inventive diplexer.

FIG. 2 shows such a second exemplary embodiment of the inventive diplexer as explained in the paragraph before. A low-pass terminal 210 is connected to a first terminal of a capacitor 271 and to a first terminal of a transmission line 274 which may be a lambda quarter line in order to transform a short of the respective switching element in form of a diode 273 into an open circuit. A second terminal of the capacitor 271 is connected to a first terminal of a capacitor 275 and to a first terminal of a resistor 276, wherein a second terminal of the resistor 276 is connected to ground. Furthermore, a second terminal of said capacitor 275 is connected to a second terminal of an inductance 272 and to a first terminal, especially the anode, of a diode 273, wherein a second terminal, especially the cathode, of said diode 273 is connected to ground and a first terminal of said inductance 272 is connected to a terminal 220 for feeding in a first control signal. Alternatively, the inductance 272 may be replaced by a resistor which may comprise a parasitic inductance, or by a combination of a resistor and an inductance. Moreover, a second terminal of the above-mentioned transmission line 274 is connected to a common terminal 230 of the diplexer 200 and to a first terminal of a capacitor 277, wherein a second terminal of said capacitor 277 is connected to a first terminal of a capacitor 279 and to a first terminal of a resistor 278, wherein a second terminal of said resistor 278 is connected to ground. Additionally, a second terminal of the above-mentioned capacitor 279 is connected to a first terminal of a capacitor 282, to a first terminal of an inductance 283, and to a first terminal, especially the anode, of a diode 281, wherein a second terminal, especially the cathode, of said diode 281 is connected to ground. Alternatively, the inductance 283 may be replaced by a resistor which may comprise a parasitic inductance, or by a combination of a resistor and an inductance. Whereas a second terminal of said capacitor 282 is connected to a high-pass terminal 240, a second terminal of the above-mentioned inductance 283 is connected to a terminal 250 for feeding in a second control signal.

As it can be seen, the low-pass terminal 210 may galvanically be connected to the common terminal 230 of the electronically switchable diplexer 200 via the transmission line 274 because the low-pass path is galvanically disconnected from the switching element and its control signal. This allows for very low operating frequencies even down to DC without limiting the maximum operating frequencies of the remaining transmission paths.

Furthermore, in accordance with the foregoing considerations regarding the suppression of transient switching disturbances, the resistors 276 and 278 are applied for dissipating the respective transient currents without having negative impact on the signal line regarding transmission characteristics.

In this context, the value of the resistor 276 should be significantly smaller than the value of the reactance of the coupling capacitor 271 with regard to operating frequencies in the ballpark of $$\frac{1}{t_{Switch}}.$$

In addition to this, the value of the resistor 276 has however to be big enough in order not to considerably influence the impedance of the signal line (transmission path) with respect to the applied operating frequencies of the low-pass path. Thus, a major part of the transient interference current is dissipated to ground via the resistor 276 without having negative impact on the remaining circuitry of the diplexer 200.

Furthermore, the usage of two capacitors 271 and 275 or capacitors 277 and 279, in combination with one resistor 276 or resistor 278, respectively leads to the dissipation of the first order time derivative of the time-varying control signal fed into the terminal 220 or into the terminal 250, respectively, in form of a transient interference current. In this case, due to the foregoing assumption of linear changes of the respective control voltages, solely the first order time derivation of the control signals exists.

Consequently, if an at least second order time derivative of the first control signal fed into the terminal 220 or an at least second order derivative of the second control signal fed into the terminal 250 exists, the potential of the connection node between the capacitors 271 and 275 or the potential of the connection node between the capacitors 277 and 279, respectively changes, which leads to further—ordinarily smaller—transient interference currents flowing through the signal line (transmission path).

Therefore, in order to advantageously suppress even transient switching disturbances caused by higher order derivatives of the first control signal fed into the terminal 220, or of the second control signal fed into the terminal 250, further serial capacitors with at least one impedance between each capacitor pair for dissipating the respective transient interference currents to ground have to be added to the inventive diplexer 200.

In addition to this, with respect to the high-pass path of the diplexer 200, the resistor 278 may be replaced by an inductance such as a bonding wire or a lambda quarter line, if the desired operating bandwidth of the diplexer 200 allows such a replacement.

Furthermore, it should be mentioned that the usage of multiple switching elements within one path would advantageously increase the isolation of this path, if the latter is switched off.

Additionally, in the case of multiple switching elements within one path and with special respect to the low-pass path, each switching element has to be equipped with its own network comprising coupling capacitors and impedances connecting each line section between said coupling capacitors to ground for the dissipation of transient interference currents.

Figure 3:
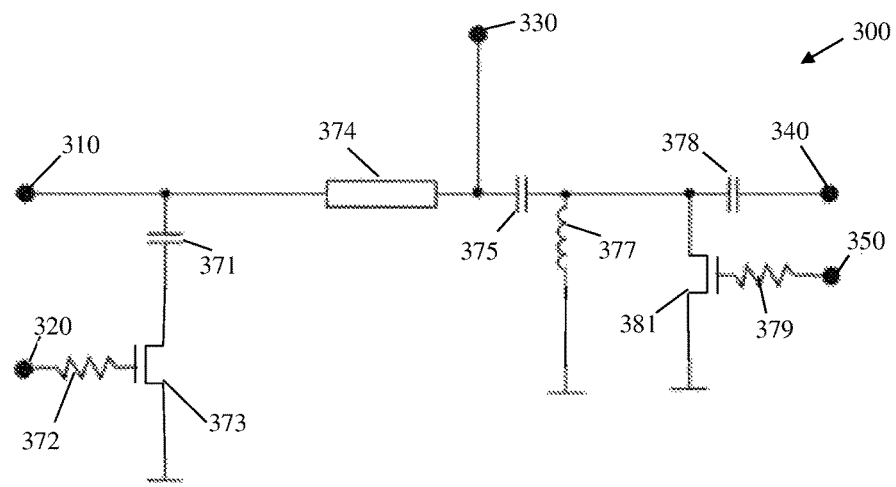
FIG. 3 shows a circuit diagram of a third exemplary embodiment of the inventive diplexer.

Now, with respect to FIG. 3, a circuit diagram of an exemplary embodiment of the inventive diplexer is shown, wherein a low-pass terminal 310 is connected to a first terminal of a capacitor 371 and to a first terminal of a transmission line 374 which may be a lambda quarter line in order to transform a short of the respective switching element in form of a transistor 373 into an open circuit. The second terminal of the capacitor 371 is connected to a first terminal, especially drain, of the transistor 373. A second terminal, especially gate, of the transistor 373 is connected to a second terminal of a resistor 372. The first terminal of the resistor 372 is connected to a terminal 320 for feeding in a first control signal. Furthermore, a third terminal, especially source, of the transistor 373 is connected to ground. The transistor 373 may be a JFET (junction field-effect transistor), a MESFET (metal-semiconductor field-effect transistor), or a MOSFET (metal-oxide-semiconductor field-effect transistor). The second terminal of the above-mentioned transmission line 374 is connected to a common terminal 330 and the first terminal of a capacitor 375. The second terminal of said capacitor 375 is connected to the first terminal of an inductance 377, to the first terminal of a capacitor 378, and to a first terminal, especially drain, of a transistor 381. A second terminal, especially gate, of the transistor 381 is connected to a first terminal of a resistor 379, and the second terminal of said resistor 379 is connected to a terminal 350 for feeding in a second control signal. A third terminal, especially source of the transistor 381, which may be a JFET, a MESFET, or a MOSFET, is connected to ground. Moreover, the second terminal of the inductance 377 is connected to ground.$_{[SB1]}$ The second terminal of the above-mentioned capacitor 378 is connected a high-pass terminal 340.

It can be seen that regarding the low-pass path of the electronically switchable diplexer 300, there is the coupling capacitor 371 connecting the switching element in form of the transistor 373 and the low-pass signal path.

As a consequence of the usage of the coupling capacitor 371, the low-pass terminal 310 may galvanically be connected to the common terminal 330 of the electronically switchable diplexer 300 via the transmission line 374 because the low-pass path is galvanically disconnected from the switching element and its control signal. This allows for very low operating frequencies even down to DC without limiting the maximum operating frequencies of the remaining transmission paths.

For instance, in order to achieve a better isolation of the low-pass path, multiple switching elements may be used. In this case, each of the switching elements has to be connected to the signal line via a coupling capacitor.

Additionally, it is to be mentioned that the above-mentioned DC decoupling is advantageous in any case—even if the switching elements comprise three or more terminals, wherein the at least one terminal for feeding in a control signal is already galvanically separated from the remaining terminals. In this case, the signal line is DC-free anyway but the operating point of the respective switching element may however be changed by applying a DC voltage to the respective output, which may lead to malfunctions of the respective switching element.

In the case of a switched off low-pass path, or respectively a conductive switched switching element, applying an external DC voltage to the signal line may damage the respective switching element. This is avoided by coupling capacitor 371. Furthermore, switching between low-pass and high-pass operation causes the respective control signals to change over time in general.

Furthermore, in general and by analogy with the foregoing exemplary embodiments, transient switching disturbances have to be suppressed in order to protect especially fragile or sensitive components or circuitry being attached to the common terminal 330 of the inventive diplexer 300 from getting damaged.

For this purpose, additional coupling capacitors and appropriate elements for the dissipation of occurring interferences can preferably be inserted into the inventive diplexer as follows.

On the one hand, the single coupling capacitor 371 of the low-pass path can be replaced by at least two coupling capacitors connected in series, and on the other hand, regarding the remaining high-pass and bandpass paths of the diplexer, the capacitor 375 located at the branching point should likewise be substituted by at least two capacitors connected in series. As a consequence of this series connection, there are one or more potential-free line sections between said capacitors, wherein each of the potential-free line sections is connected to ground via an appropriate resistor, an inductivity, a lambda quarter line or a combination thereof in order to dissipate a major part of the transient interference current without having negative impact on the signal line (transmission path) regarding the transmission characteristics.

Figure 4:
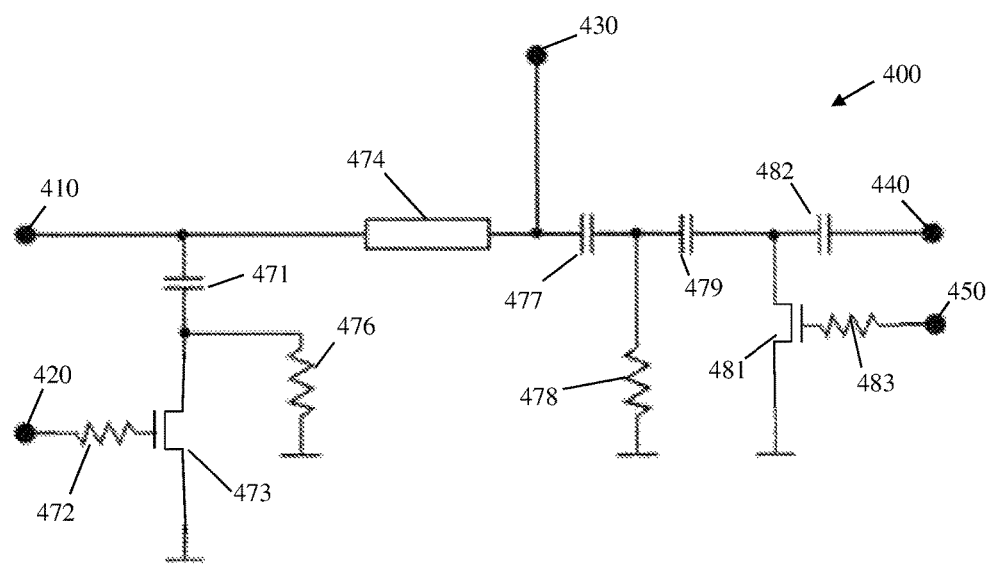
FIG. 4 shows a circuit diagram of a fourth exemplary embodiment of the inventive diplexer.

Now, with respect to FIG. 4, a fourth exemplary embodiment of the inventive diplexer is shown. A low-pass terminal 410 is connected to a first terminal of a capacitor 471 and to a first terminal of a transmission line 474 which may be a lambda quarter line in order to transform a short of the respective switching element in form of a transistor 473 into an open circuit. A second terminal of the capacitor 471 is connected to a first terminal, especially drain, of a transistor 473 and to a first terminal of a resistor 476, wherein a second terminal of the resistor 476 is connected to ground. Furthermore, a second terminal, especially gate, of said transistor 473 is connected to a second terminal of a resistor 472, wherein a first terminal of said resistor 472 is connected to a terminal 420 for feeding in a first control signal. The transistor 473 may be a JFET, a MESFET, or a MOSFET. A third terminal of the transistor 473, especially source, is connected to ground. Moreover, the second terminal of the above-mentioned transmission line 474 is connected to a common terminal 430 of the diplexer 400 and to a first terminal of a capacitor 477, wherein a second terminal of said capacitor 477 is connected to a first terminal of a capacitor 479 and to a first terminal of a resistor 478, wherein a second terminal of said resistor 478 is connected to ground. Additionally, a second terminal of the above-mentioned capacitor 479 is connected to a first terminal of a capacitor 482, and to a first terminal, especially drain, of a transistor 481, wherein a second terminal, especially gate, of said transistor 481 is connected to a first terminal of a resistor 483, and a third terminal, especially source, of the transistor 481 is connected to ground. The transistor 481 may be a JFET, a MESFET, or a MOSFET. Furthermore, whereas the second terminal of said capacitor 482 is connected to a high-pass terminal 440, a second terminal of the above-mentioned resistor 483 is connected to a terminal 450 for feeding in a second control signal.

As it can be seen, the low-pass terminal 410 may galvanically be connected to the common terminal 430 of the electronically switchable diplexer 400 via the transmission line 474 because the low-pass path is galvanically disconnected from the switching element and its control signal. This allows for very low operating frequencies even down to DC without limiting the maximum operating frequencies of the remaining transmission paths.

Furthermore, in accordance with the foregoing considerations regarding the suppression of transient switching disturbances, the resistors 476 and 478 are applied for dissipating the respective transient currents without having negative impact on the signal line regarding transmission characteristics.

In this context, the value of the resistor 476 should be significantly smaller than the value of the reactance of the coupling capacitor 471 with regard to operating frequencies in the ballpark of $$\frac{1}{t_{Switch}}.$$

In addition to this, the value of the resistor 476 has however to be big enough in order not to considerably influence the impedance of the signal line (transmission path) with respect to the applied operating frequencies of the low-pass path. Thus, a major part of the transient interference current is dissipated to ground via the resistor 476 without having negative impact on the remaining circuitry of the diplexer 400.

Furthermore, the usage of two capacitors 471 and 475 or capacitors 477 and 479, in combination with one resistor 476 or resistor 478, respectively leads to the dissipation of the first order time derivative of the time-varying control signal fed into the terminal 420 or into the terminal 450, respectively, in form of a transient interference current. In this case, due to the foregoing assumption of linear changes of the respective control voltages, solely the first order time derivation of the control signals exists.

Consequently, if an at least second order time derivative of the first control signal fed into the terminal 420 or an at least second order derivative of the second control signal fed into the terminal 450 exists, the potential of the connection node between the capacitors 471 and 475 or the potential of the connection node between the capacitors 477 and 479, respectively changes, which leads to further ordinarily smaller—transient interference currents flowing through the signal line (transmission path).

Therefore, in order to advantageously suppress even transient switching disturbances caused by higher order derivatives of the first control signal fed into the terminal 420, or of the second control signal fed into the terminal 450, further serial capacitors with at least one impedance between each capacitor pair for dissipating the respective transient interference currents to ground have to be added to the inventive diplexer 400.

In addition to this, with respect to the high-pass path of the diplexer 400, the resistor 478 may be replaced by an inductance such as a bonding wire or a lambda quarter line, if the desired operating bandwidth of the diplexer 400 allows such a replacement.

Furthermore, it should be mentioned that the usage of multiple switching elements within one path would advantageously increase the insulation of this path, if the latter is switched off.

Additionally, in the case of multiple switching elements within one path and with special respect to the low-pass path, each switching element has to be equipped with its own network comprising coupling capacitors and impedances connecting each line section between said coupling capacitors to ground for the dissipation of transient interference currents.

Figure 5:
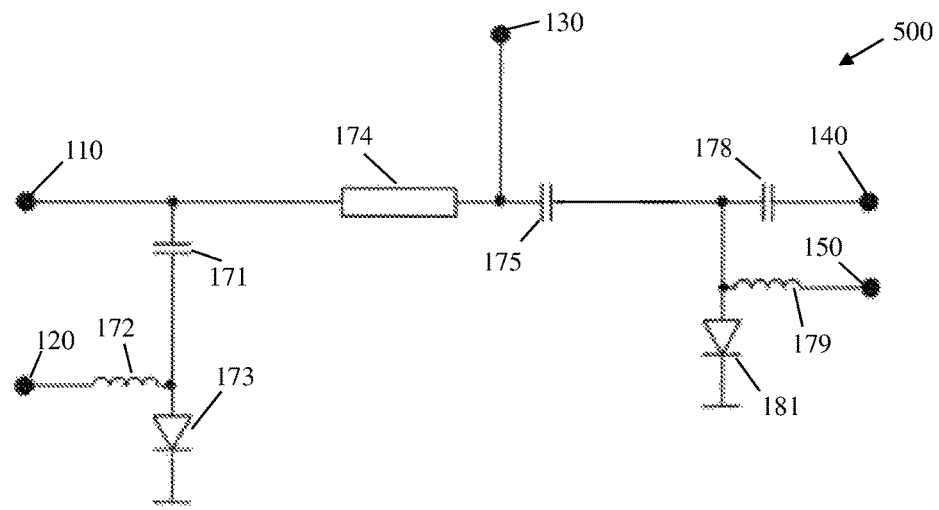
FIG. 5 shows a circuit diagram of a fifth exemplary embodiment of the inventive diplexer.

Now, with respect to FIG. 5, a fifth exemplary embodiment of the inventive diplexer is shown, which is nearly identical to the first exemplary embodiment according to FIG. 1. Accordingly, the reference signs of these figures correspond to one another. Differentially to the first exemplary embodiment of the inventive diplexer according to FIG. 1, the capacitor 176 and the inductance 177 have been removed.

Figure 6:
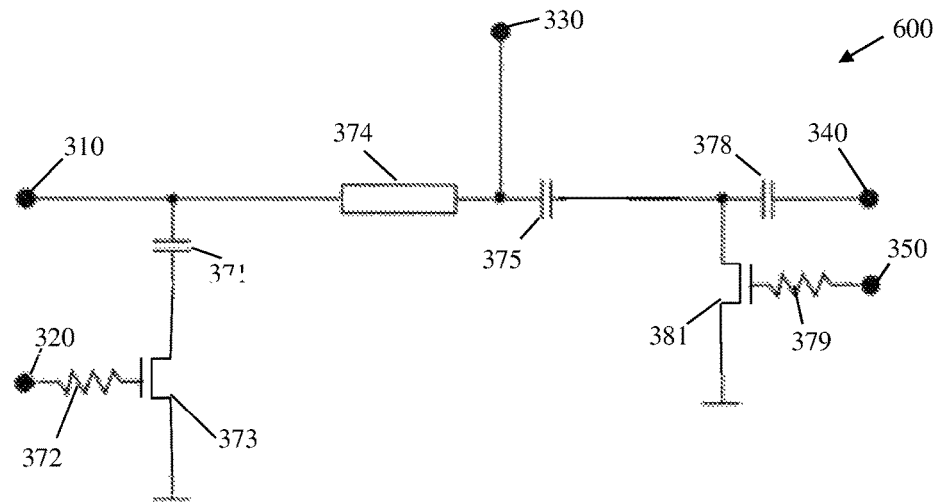
FIG. 6 shows a circuit diagram of a sixth exemplary embodiment of the inventive diplexer.

By analogy with the foregoing paragraph, FIG. 6 shows a sixth exemplary embodiment of the inventive diplexer, which is nearly identical to the third exemplary embodiment according to FIG. 3. Consequently, the reference signs of these figures correspond to one another. Differentially to the third exemplary embodiment of the inventive diplexer according to FIG. 3, the inductance 377 has been removed.

Figure 7:
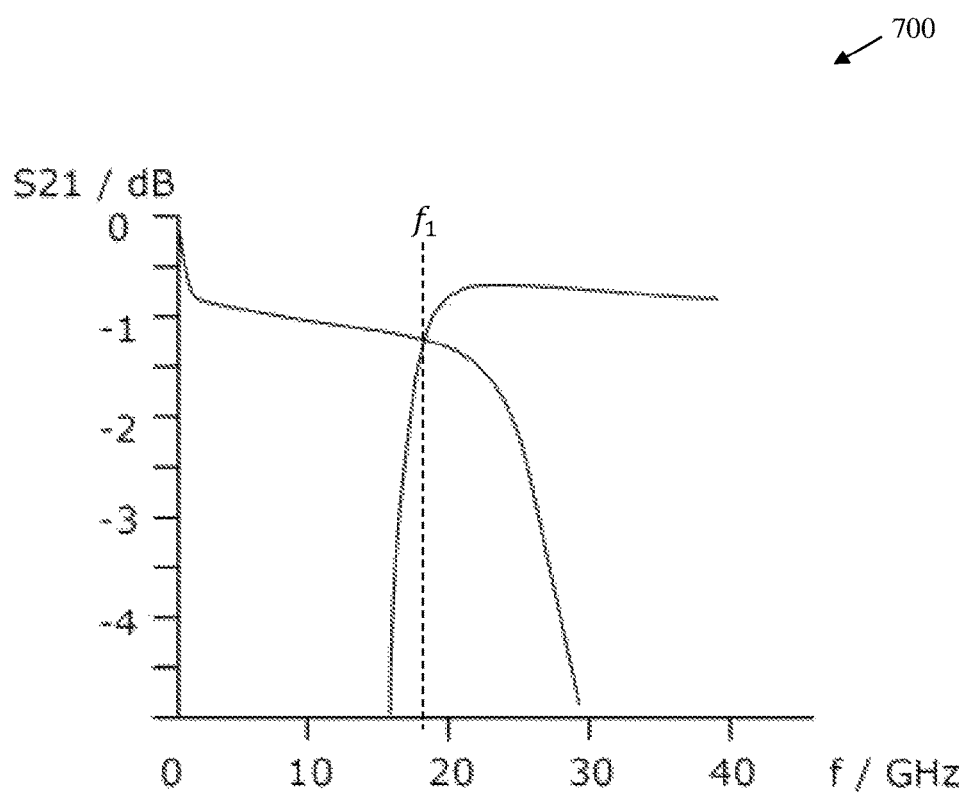
FIG. 7 shows an exemplary graph of insertion loss with respect to operating frequency.

Finally, FIG. 7 illustrates an exemplary graph of insertion loss with respect to operating frequency.

As it can be seen, the different frequency ranges are advantageously adjacent to each other, or respectively overlap.

Further advantageously, at switching frequency $f_1$, or respectively at mid-band, the transmission line 174, 274, 374, 474 is chosen as being a lambda quarter line.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A diplexer with
a first terminal for a first RF signal (110 low pass) connected via a first transmission path to a common terminal (130),
a second terminal for a second RF signal (140 high pass) connected via a second transmission path to the common terminal (130),
wherein the first transmission path is connected to a ground potential via a first switching element (diode 173), which has no galvanic connection to the common terminal (130),
wherein the second transmission path is connected to the ground potential via a second switching element (diode 181), which has no galvanic connection to the common terminal (130),
wherein the switching elements are semiconductor devices (diodes 173 and 181),
wherein the first transmission path comprises a transmission line, and
wherein a connection point between the first terminal and the transmission line is connected to the first switching element via a first capacitor.

2. The diplexer according to claim 1,
wherein the first switching element has no galvanic connection to the first terminal or the second terminal.

3. The diplexer according to claim 1,
wherein the second switching element has no galvanic connection to the first terminal or the second terminal.

4. The diplexer according to claim 1,
wherein the side of the first capacitor, which is not connected to the first transmission path, is connected to the first switching element and wherein the first switching element is biased with a first control signal.

5. The diplexer according to claim 1,
wherein the first transmission path comprises a transmission line and
wherein a connection point between the first terminal and the transmission line is connected to the first switching element via a first capacitor and a second capacitor.

6. The diplexer according to claim 5,
wherein the side of the second capacitor, which is not connected to the first capacitor, is connected to the first switching element and wherein the first switching element is biased with a first control signal.

7. The diplexer according to claim 5,
wherein a connection point between the first capacitor and the second capacitor is connected to the ground potential via a resistor, an inductor, a transmission line or a combination thereof.

8. The diplexer according to claim 5,
wherein multiple capacitors are connected between the connection point and the first switching element.

9. The diplexer according to claim 5,
wherein the side of the last capacitor which is not connected to another capacitor and is not connected to the first transmission path, is connected to the first switching element, and
wherein the first switching element is biased with a first control signal.

10. The diplexer according to claim 1,
wherein the second transmission path comprises a first capacitor arranged between a connection point connected with the second switching element and the common terminal.

11. The diplexer according to claim 10,
wherein the second transmission path comprises a second capacitor between a connection point connected to the second switching element (181) and the second terminal (140).

12. The diplexer according to claim 11,
wherein the connection point is connected to the ground potential via an inductor (377) or a serial arrangement of a third capacitor (176) and an inductor (177).

13. The diplexer according to claim 11,
wherein the second switching element is biased with a second control signal.

14. The diplexer according to claim 11,
wherein each connection point between two of said capacitors is connected to ground via a resistor (278 or 478), an inductor (177 or 377), a transmission line or a combination thereof.

15. The diplexer according to claim 1,
wherein the second transmission path comprises a serial arrangement of a first capacitor (277 or 477) and a second capacitor (279 or 479) arranged between a connection point connected to the second switching element and the common terminal.

16. The diplexer according to claim 15,
wherein a connection point between the first capacitor and the second capacitor is connected to the ground potential via a resistor (278 or 478), an inductor, a transmission line or a combination thereof.

17. The diplexer according to claim 15,
wherein the second transmission path comprises a third capacitor (282 or 482) arranged between the second capacitor and the second terminal.

18. The diplexer according to claim 17,
wherein a connection point between the second capacitor (279 or 479) and the third capacitor (282 or 482) is connected to the second switching element (281 or 481) and is biased with a second control signal (250 or 450).

19. The diplexer according to claim 1,
wherein the first switching element and the second switching element are diodes (181 or 281) or transistors (381 or 481).

20. The diplexer according to claim 19,
wherein the diodes are PIN-diodes and the transistors are field effect transistors, respectively.

21. A diplexer with
a first terminal for a first RF signal connected via a first transmission path to a common terminal,
a second terminal for a second RF signal connected via a second transmission path to the common terminal,
wherein the first transmission path contains a first switching element, which has no galvanic connection to the common terminal,
wherein the second transmission path contains a second switching element, which has no galvanic connection to the common terminal,
wherein the switching elements are semiconductor devices,
wherein through switching the first switching element to the open state and switching the second switching element to the conducting state, the first transmission path is set to the on-state and the second transmission path is set to the off-state,
wherein through switching the first switching element to the conducting state and switching the second switching element to the open state the first transmission path is set to the off-state and the second transmission path is set to the on-state, wherein the first transmission path comprises a transmission line, and wherein a connection point between the first terminal and the transmission line is connected to the first switching element via a first capacitor.

22. A diplexer comprising:

a first terminal for a first RF signal (110 low pass) connected via a first transmission path to a common terminal (130), a second terminal for a second RF signal (140 high pass) connected via a second transmission path to the common terminal (130), wherein the first transmission path is connected to a ground potential via a first switching element (diode 173), which has no galvanic connection to the common terminal (130), wherein the second transmission path is connected to the ground potential via a second switching element (diode 181), which has no galvanic connection to the common terminal (130), wherein the switching elements are semiconductor devices (diodes 173 and 181), wherein the second transmission path comprises a first capacitor arranged between a connection point connected with the second switching element and the common terminal, wherein the second transmission path comprises a second capacitor between a connection point connected to the second switching element (181) and the second terminal (140), and wherein the connection point is connected to the ground potential via an inductor (377) or a serial arrangement of a third capacitor (176) and an inductor (177).

* * * * *